US012796475B2

(12) United States Patent
Lim et al.

(10) Patent No.: US 12,796,475 B2
(45) Date of Patent: Nov. 10, 2026

(54) ELIMINATING SUBSTRATE METAL CRACKS IN A BALL GRID ARRAY PACKAGE

(71) Applicant: NXP USA, Inc., Austin, TX (US)

(72) Inventors: Swee Yean Lim, Petaling Jaya (MY); Ly Hoon Khoo, Port Klang (MY); Huanhuan Liu, Tianjin (CN)

(73) Assignee: NXP USA, INC., Austin, TX (US)

( * ) Notice: Subject to any disclaimer, the term of this patent is extended or adjusted under 35 U.S.C. 154(b) by 394 days.

(21) Appl. No.: 18/479,144

(22) Filed: Oct. 2, 2023

(65) Prior Publication Data

US 2024/0203905 A1 Jun. 20, 2024

(30) Foreign Application Priority Data

Dec. 15, 2022 (CN) ......................... 202211614334.9

(51) Int. Cl.

| | |
|---|---|
| ***H10W 74/01*** | (2026.01) |
| ***H10W 42/00*** | (2026.01) |
| ***H10W 70/05*** | (2026.01) |
| ***H10W 70/65*** | (2026.01) |
| ***H10W 72/00*** | (2026.01) |
| ***H10W 90/00*** | (2026.01) |
| *H10W 72/30* | (2026.01) |

(52) U.S. Cl.

CPC ......... *H10W 42/121* (2026.01); *H10W 70/05* (2026.01); *H10W 70/65* (2026.01); *H10W 74/01* (2026.01); *H10W 90/701* (2026.01); *H10W 72/07337* (2026.01); *H10W 72/354* (2026.01); *H10W 72/884* (2026.01); *H10W 90/734* (2026.01); *H10W 90/754* (2026.01)

(58) Field of Classification Search

CPC combination set(s) only.
See application file for complete search history.

(56) References Cited

U.S. PATENT DOCUMENTS

| | | | | |
|---|---|---|---|---|
| 6,399,182 | B1 | 6/2002 | Rubel et al. | |
| 8,982,577 | B1 * | 3/2015 | Fuentes ............... | H10W 74/012 361/783 |
| 2005/0211680 | A1 | 9/2005 | Li et al. | |
| 2014/0001644 | A1 | 1/2014 | Yu et al. | |
| 2016/0172309 | A1 * | 6/2016 | Gong .................... | H10W 42/20 257/659 |
| 2022/0148955 | A1 | 5/2022 | Su et al. | |

* cited by examiner

*Primary Examiner* — Hoai V Pham

(57) ABSTRACT

An apparatus includes a substrate including a planar surface. A die is attached to the planar surface of the substrate with an interposed die attach material. A solder mask is interposed between the die attach material and the planar surface. The solder mask includes a recessed portion extending beneath a periphery of the die, and the recessed portion is filled with a molding underfill.

19 Claims, 6 Drawing Sheets

ELIMINATING SUBSTRATE METAL CRACKS IN A BALL GRID ARRAY PACKAGE

CROSS-REFERENCE TO RELATED APPLICATION

This application claims priority under 35 U.S.C. § 119 to Chinese patent application no. 202211614334.9, filed 15 Dec. 2022, the contents of which are incorporated by reference herein.

FIELD

This disclosure relates generally to packaging of electronic components, and more specifically to the reduction of stress-induced cracks in a Ball Grid Array (BGA) package.

BACKGROUND

Electronic component packaging includes the use of dissimilar materials, each with different temperature coefficients of expansion, thermal conductivity and the like. During component qualification and ultimately field operation, these various materials may expand and contract in ways that will introduce cracks leading to component failure. In particular, die attach epoxy may be used to attach a die (e.g., semiconductor die), to a substrate. The die attach epoxy will exhibit differential stress across the width of a die and expand or contract at a different rate to the die or substrate, when the package in temperature cycled. Such stress may lead to cracks forming in the epoxy, which may further lead to cracks in the substrate and electrical connections therein.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for the elimination, or substantial reduction, of substrate metal cracks in a BGA package as a result of die attach epoxy cracks propagating downward through the metallization patterns of the underlying substrate. Epoxy cracks due to thermal stress are prevented from propagating by forming a recessed portion beneath the die periphery and filling this portion with molding underfill.

Figure 1:
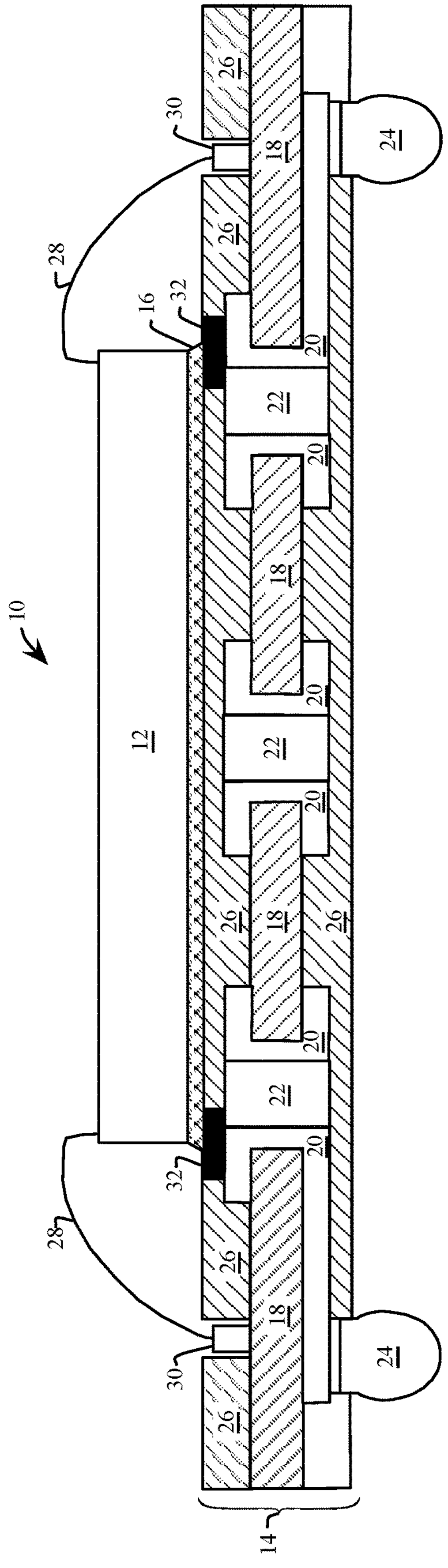
FIG. 1 is a cross-sectional view of a BGA assembly, in accordance with an embodiment of the present disclosure.

FIG. 1 shows a cross-sectional view of a BGA package 10, in accordance with an embodiment of the present disclosure. The BGA package 10 includes a die (e.g. a semiconductor die, a III/V compound die, a GaN die and the like), attached to a substrate 14 with a die attach material 16. The substrate 14 further includes a substrate core 18, a plurality of copper interconnect (or traces) 20 connected to vias 22 and solder balls 24. A solder mask 26 is applied to both sides of the substrate core 18. The die 12 is bonded with bond wires 28 to bond fingers 30 (shown with optional plating). A recessed portion 32 is formed under the periphery of the die 12 and filled with molding underfill. In one embodiment, a plan view of the recessed portion 32 follows the same shape as the periphery of the die 12. In another embodiment, the recessed portion 32 includes chamfered or rounded corners.

Figure 2:
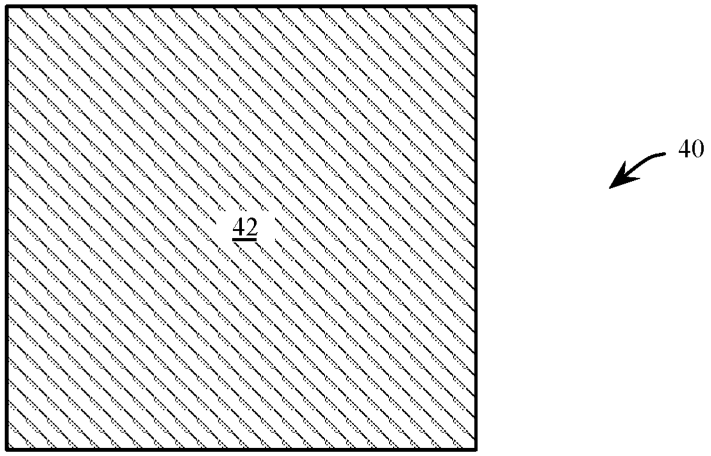
FIG. 2 is a plan view of an embodiment of a BGA package, in accordance with a manufacturing step of the present disclosure.

FIG. 2 shows a plan view of an embodiment of a BGA package 40, in accordance with a manufacturing step of the present disclosure. FIG. 2 with continued reference to FIG. 1 shows a first layer 42 of a solder mask applied to a BGA substrate (e.g., a portion of the solder mask 26 of FIG. 1). FIG. 2 shows the first layer 42 of the solder mask applied to a top surface of the BGA substrate. In one embodiment, the first layer may also be applied to a bottom surface (not shown) of the BGA substrate.

Figure 3:
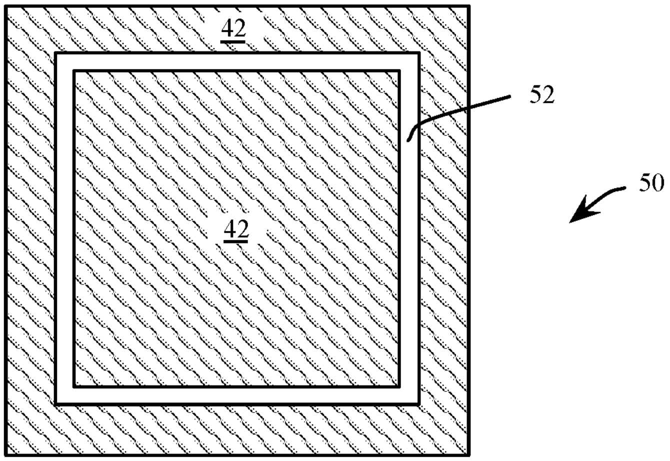
FIG. 3 is a plan view of an embodiment of a BGA package, in accordance with another manufacturing step of the present disclosure.

FIG. 3 shows a plan view of an embodiment of a BGA package 50, in accordance with a manufacturing step of the present disclosure. FIG. 3 with continued reference to FIG. 2 shows a bonding area 52 exposed by removing part of the first layer 42 of the solder mask. In one embodiment, the bonding area 52 is exposed by a photolithographic process.

Figure 4:
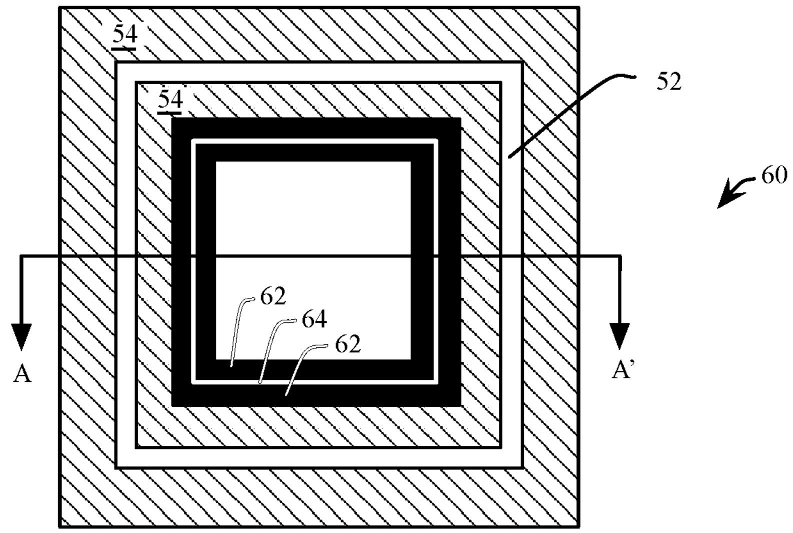
FIG. 4 is a plan view of an embodiment of a BGA package, in accordance with another manufacturing step of the present disclosure.

FIG. 4 shows a plan view of an embodiment of a BGA package 60, in accordance with a manufacturing step of the present disclosure. Subsequent to the exposure of the bonding area 52, a second layer of the solder mask is applied to the first layer 52 to form a combined solder mask 54. FIG. 4 with continued reference to FIG. 3 shows the bonding area 52 exposed again while also forming (and then filling) a filled recessed portion 62 in the solder mask. In one embodiment, the filled recessed portion 62 has a same depth as a thickness of the second layer. In another embodiment, the depth of the filled recessed portion 62 is different than the thickness of second layer but less than the total thickness of the solder mask, including the first layer and second layer of the solder mask. In one embodiment, a centerline 64 of the filled recessed portion 62 may align with a periphery of a die (not shown) to be affixed to the BGA package 60.

Figure 5:
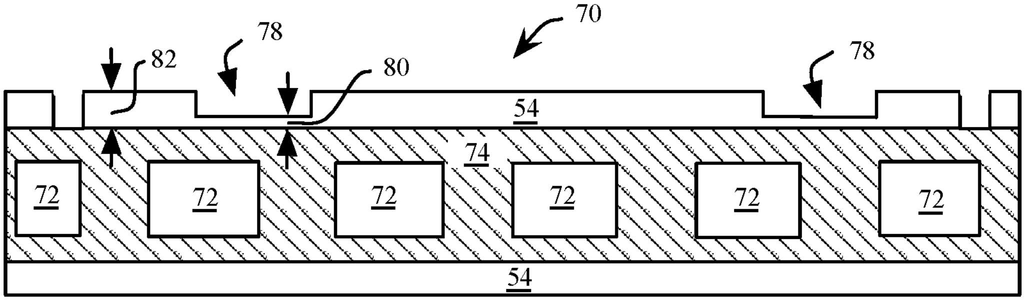
FIG. 5 is a cross-sectional view of a preceding manufacturing step to the embodiment of FIG. 4 taken along line A-A', in accordance with the present disclosure.

FIG. 5 shows a cross-sectional view of a preceding manufacturing step to the embodiment of FIG. 4 taken along line A-A', in accordance with the present disclosure. The embodiment 70 of FIG. 5 includes a substrate core 72 and metallization 74 (e.g., copper interconnect), similar to the substrate core 18 and metallization 20 of FIG. 1. A combined solder mask 54 is formed on a top surface of the embodiment 70. In one embodiment, the combined solder mask 54 is also formed on a bottom surface of the embodiment 70. The combined solder mask 54 includes a recessed portion 78 formed in the combined solder mask 54, prior to filling. The combined solder mask 54 includes the first layer 42 having a first thickness 80. The combined solder mask 54 including the application of the first layer 42 and the second layer has a combined thickness 82.

Figure 6:
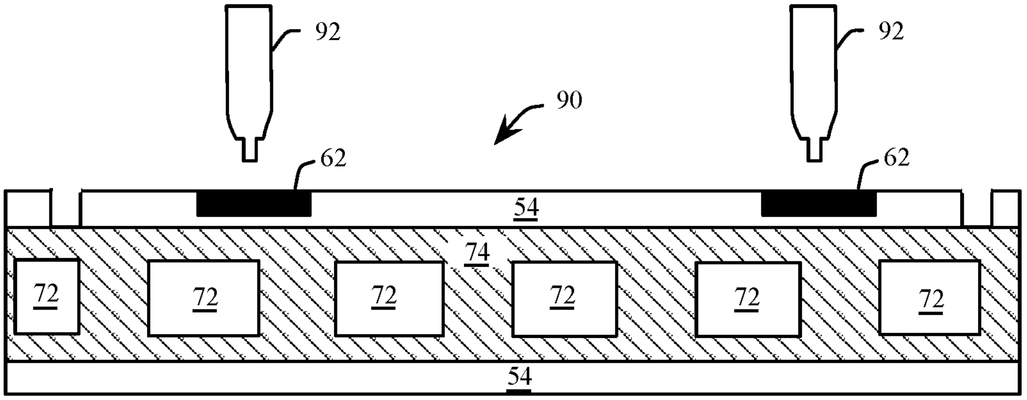
FIG. 6 is a cross-sectional view of the embodiment of FIG. 4 taken along line A-A', in accordance with another manufacturing step of the present disclosure.

FIG. 6 shows an embodiment 90 of a cross-sectional view of FIG. 4 taken along line A-A', in accordance with another manufacturing step of the present disclosure. FIG. 6, with continued reference to FIG. 4 and FIG. 5 shows the filling of the recessed portion 78 with a dispenser 92, to form the filled recessed portion 62. In one embodiment, the filled recessed portion 62 includes a same molding underfill, subsequently used to encapsulate the embodiment 90. In another embodiment, the filled recessed portion 62 includes a different molding underfill, subsequently used to encapsulate the embodiment 90.

Figure 7:
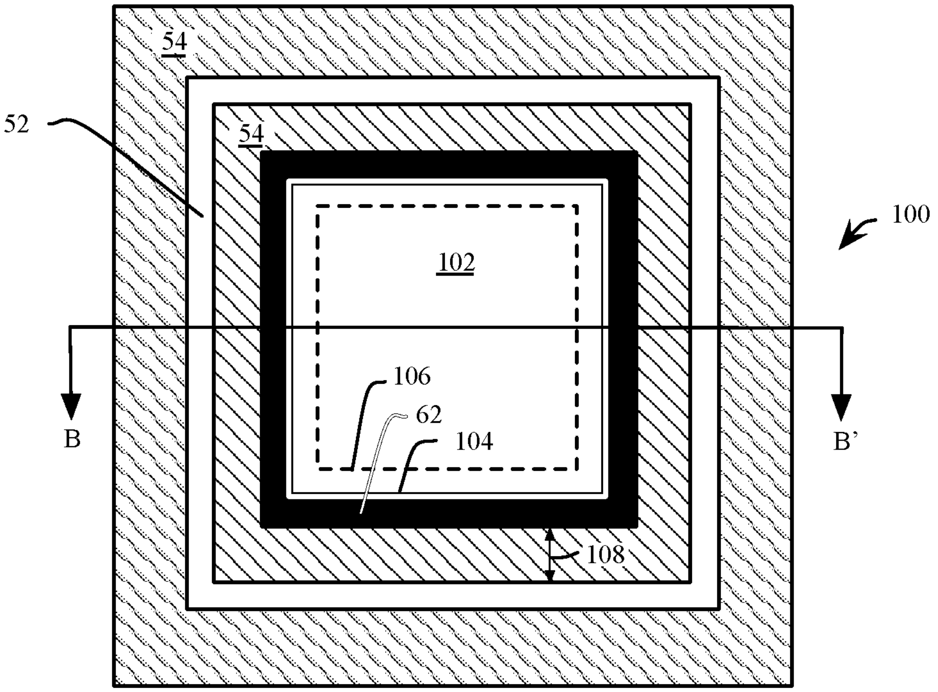
FIG. 7 is a plan view of an embodiment of a BGA package, in accordance with another manufacturing step of the present disclosure.

FIG. 7 shows a plan view of an embodiment 100 of a BGA package, in accordance with another manufacturing step of the present disclosure. FIG. 7, with continued reference to FIG. 4, shows a die 102 placed over the filled recessed portion 62. In the embodiment 100, a periphery 104 of the die is preferably aligned to be coincident with the centerline 64 (illustrated in FIG. 4) of the filled recessed portion 62. In one embodiment, the filled recessed portion 62 is formed with a minimum keep out distance 108 from the bonding area 52 to ensure adequate room is available for bonding a bonding wire to the bonding area 52.

Figure 8:
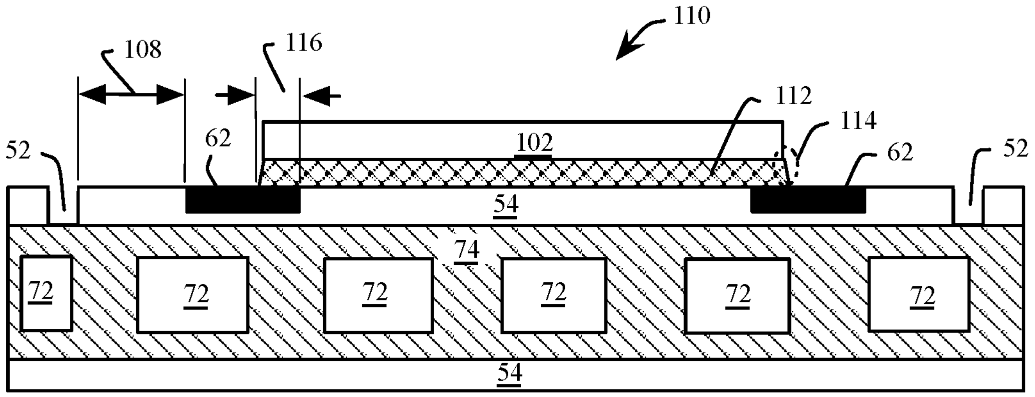
FIG. 8 is a cross-sectional view of the embodiment of FIG. 7 taken along line B-B', in accordance with another manufacturing step of the present disclosure.

FIG. 8 shows an embodiment 110 of a cross-sectional view of FIG. 7 taken along line B-B', in accordance with another manufacturing step of the present disclosure. FIG. 8, with continued reference to FIG. 6 and FIG. 7 shows the die 102 attached to the combined solder mask 54 with a die attach material 112. The die attach material 112 includes a bleed out area 114, where the die attach material 112 extrudes or bleeds out from under the die 102. In one embodiment, the filled recessed portion 62 has a width to ensure a minimum keep out distance 108 from the bonding area 52. The width of the filled recessed portion 62 is further defined by a bleed out distance 116. In another embodiment, the die 102 may be slightly misaligned with respect to the centerline 64 due to manufacturing tolerances, as long as the width of the filled recessed portion 62 is sufficient to satisfy the minimum required keep out distance 108 and minimum required bleed out distance 116.

Figure 9:
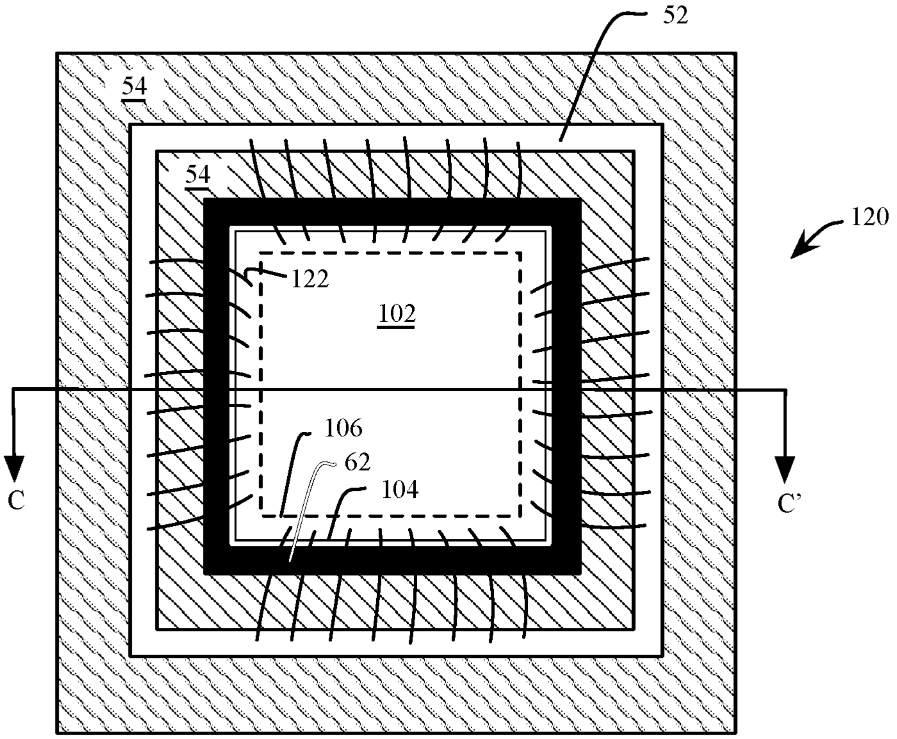
FIG. 9 is a plan view of an embodiment of a BGA package, in accordance with another manufacturing step of the present disclosure.
Figure 10:
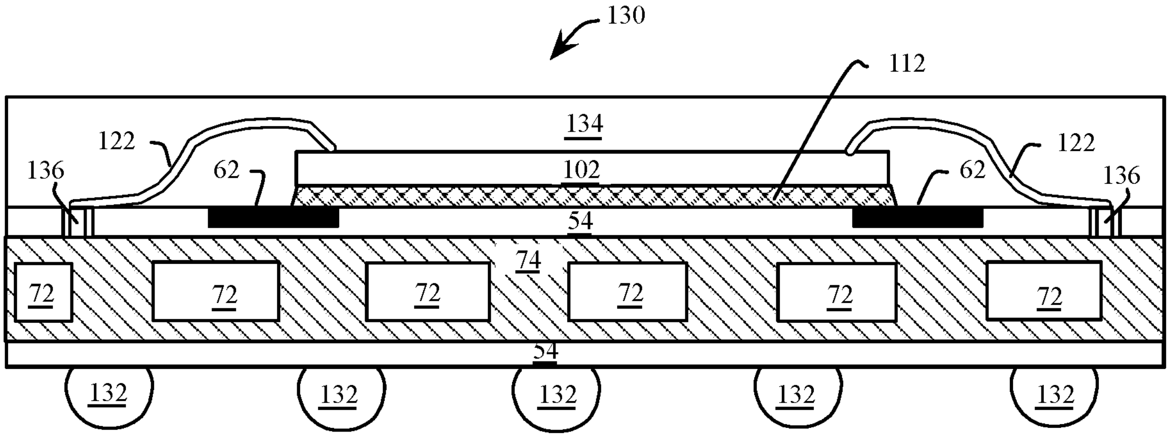
FIG. 10 is a cross-sectional view of the embodiment of FIG. 9 taken along line C-C', in accordance with another manufacturing step of the present disclosure.

FIG. 9 shows a plan view of an embodiment 120 of a BGA package, in accordance with another manufacturing step of the present disclosure. In the embodiment 120, a plurality of bond wires 122 electrically connect circuitry on the die 102 to bond fingers in the bond area 52. The bond fingers further connect to solder balls, similar to solder balls 24 of FIG. 1, through the metallization 74 (see FIG. 8). FIG. 10 shows an embodiment 130 of a cross-sectional view of FIG. 9 taken along line C-C', in accordance with another manufacturing step of the present disclosure. The embodiment 130 shows a finalized BGA package, with attached solder balls 132 on a bottom surface of the BGA. In one embodiment, the same molding underfill 134 used to fill the filled recessed portion 62 is used to encapsulate the BGA. In another embodiment, a different molding underfill 134 used to fill the filled recessed portion 62 is used to encapsulate the BGA. In another embodiment, the bonding area 52 may further include plating 136 to facilitate attaching bond wires 122 to the bond fingers in the bonding area 52.

Figure 11:
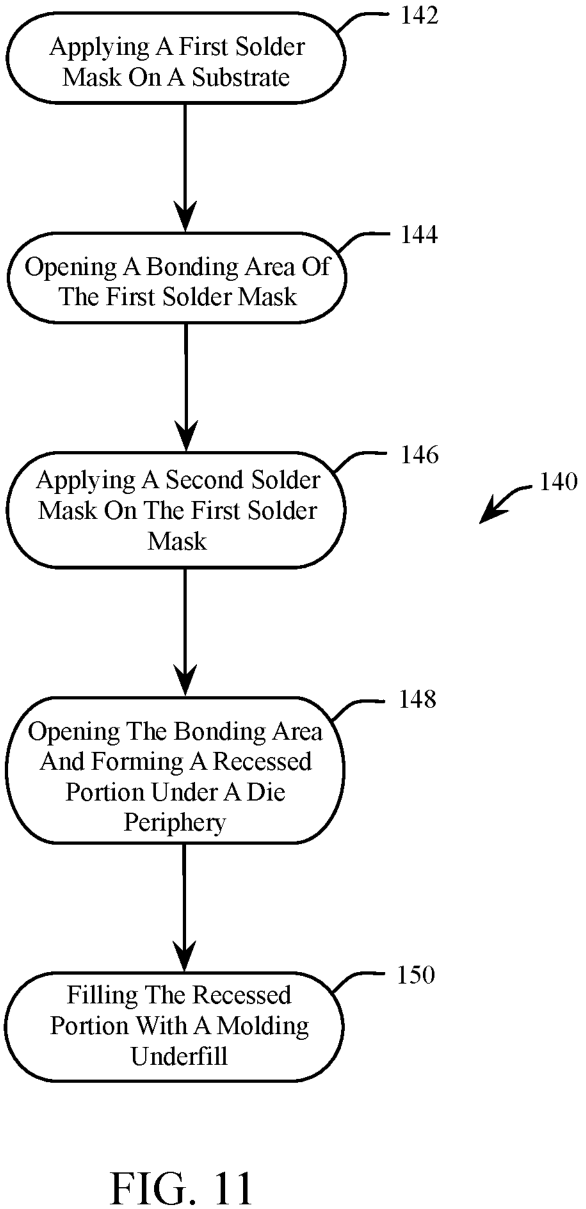
FIG. 11 is a flowchart representation of a method to eliminate substrate metal cracks in a BGA, in accordance with an embodiment of the present disclosure.

FIG. 11 shows an embodiment 140 of a method to eliminate substrate metal cracks in a BGA, in accordance with an embodiment of the present disclosure. With continued reference to FIG. 2, FIG. 3, FIG. 5, FIG. 6 and FIG. 7, at 142 a first solder mask 42, (see FIG. 2) is applied to a substrate. At 144, a bonding area 52 is opened on the first solder mask 42, (see FIG. 3). At 146, a second solder mask is applied to the first solder mask, thereby forming a combined solder mask 54, (see FIG. 5). At 148, the bonding area 52 is reopened while forming a recessed portion 78 under a die periphery 104, (see FIG. 5 and FIG. 7). At 150, the recessed portion 78 is filled with a molding underfill to form a filled recessed portion 62 (see FIG. 6).

As will be appreciated, at least some of the embodiments as disclosed include at least the following. In one embodiment, an apparatus comprises a substrate comprising a planar surface. A die is attached to the planar surface of the substrate with an interposed die attach material. A solder mask is interposed between the die attach material and the planar surface, wherein the solder mask comprises a recessed portion extending beneath a periphery of the die, the recessed portion filled with a molding underfill.

Alternative embodiments of the apparatus include one of the following features, or any combination thereof. The solder mask comprises a first layer applied to the planar surface and a second layer applied on the first layer. The recessed portion comprises a depth equal to a thickness of the second layer. The recessed portion extends in a direction parallel to the planar surface and comprises a width greater than a bleed out distance of the die attach material. The width ensures the recessed portion is formed in the solder mask at least a minimum distance from a bond finger configured to bond with a wired connection to the die. The periphery of the die bisects the recessed portion. The die attach material comprises epoxy. The molding underfill filling the recessed portion is a same type of molding underfill used to encapsulate the die. The apparatus is a Ball Grid Array (BGA). The BGA is a Molded Array Process BGA.

In another embodiment, a method to eliminate substrate metal cracks in a ball grid array package comprises applying a first solder mask on a planar surface of a substrate. A bonding area of the first solder mask is opened to expose a bond finger configured to bond with a wired connection to a die. A second solder mask is applied on the first solder mask. The bonding area is opened to expose the bond finger and form a recessed portion under a periphery of the die. The recessed portion is filled with a molding underfill.

Alternative embodiments of the method to eliminate substrate metal cracks in a ball grid array package include one of the following features, or any combination thereof. The die is attached to the second solder mask with a die attach material, wherein the periphery of the die bisects the recessed portion. The die is encapsulated with the molding underfill. A minimum width of the recessed portion is determined by a bleed out distance of the die attach material. A maximum width of the recessed portion is determined by defining a minimum distance of the recessed portion from a bond finger configured to bond with a wired connection to the die.

In another embodiment, an apparatus comprises a substrate comprising a first surface opposing a second surface, wherein the second surface comprises a plurality of solder balls arranged in a ball grid array. A die is attached to the first surface of the substrate with an interposed die attach material. A solder mask is interposed between the die attach material and the first surface, wherein the solder mask comprises a recessed portion extending beneath a periphery of the die, the recessed portion filled with a molding underfill used to encapsulate the die.

Alternative embodiments of the apparatus include one of the following features, or any combination thereof. The periphery of the die bisects the recessed portion. The recessed portion extends in a direction parallel to the planar surface and comprises a width greater than a bleed out distance of the die attach material. The width ensures the recessed portion is formed in the solder mask at least a minimum distance from a bond finger configured to bond with a wired connection to the die. The solder mask comprises a first layer applied to the first surface and a second layer applied on the first layer, wherein the recessed portion comprises a depth equal to a thickness of the second layer.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An apparatus comprising:

a substrate comprising a first surface opposing a second surface, wherein the first surface is defined by a solder mask that includes a recessed portion;

a first molding underfill that fills the recessed portion; and a die attached to the first surface of the substrate with a die attach material that is distinct from the first molding underfill, wherein the recessed portion and the first molding underfill extend beneath a periphery of the die.

2. The apparatus of claim 1 wherein the solder mask comprises a first layer and a second layer applied on the first layer.

3. The apparatus of claim 2 wherein the recessed portion comprises a depth equal to a thickness of the second layer.

4. The apparatus of claim 1 wherein the recessed portion extends outward from the periphery of the die, and a width of the recessed portion is greater than a bleed out distance of the die attach material.

5. The apparatus of claim 4 wherein the width ensures the recessed portion is formed in the solder mask at least a minimum distance from a bond finger configured to bond with a wired connection to the die.

6. The apparatus of claim 4 wherein the periphery of the die bisects the recessed portion.

7. The apparatus of claim 1 wherein the die attach material comprises epoxy.

8. The apparatus of claim 1, further comprising:

a second molding underfill that encapsulates the die, wherein the first molding underfill filling the recessed portion is a same material as the second molding underfill used to encapsulate the die.

9. The apparatus of claim 1 wherein the apparatus is a Ball Grid Array (BGA).

10. The apparatus of claim 9 wherein the BGA is a Molded Array Process BGA.

11. A method comprising:

filling a recessed portion of a solder mask with a first molding underfill, wherein the solder mask defines a first surface of a substrate; and attaching a die to the first surface of the substrate with a die attach material that is distinct from the first molding underfill, wherein the recessed portion and the first molding underfill extend beneath a periphery of the die.

12. The method of claim 11 wherein the periphery of the die bisects the recessed portion.

13. The method of claim 11 further comprising encapsulating the die with a second molding underfill that is a same material as the first molding underfill.

14. The method of claim 11 wherein a width of the recessed portion is greater than a bleed out distance of the die attach material.

15. An apparatus comprising:

a substrate comprising a first surface opposing a second surface, wherein the first surface is defined by a solder mask that includes a recessed portion, and wherein the second surface comprises a plurality of solder balls arranged in a ball grid array;

a first molding underfill that fills the recessed portion of the solder mask; and a die attached to the first surface of the substrate with a die attach material that is distinct from the first molding underfill, wherein the recessed portion and the first molding underfill extend beneath a periphery of the die.

16. The apparatus of claim 15 wherein the periphery of the die bisects the recessed portion.

17. The apparatus of claim 15 wherein the recessed portion extends outward from the periphery of the die, and a width of the recessed portion is greater than a bleed out distance of the die attach material.

18. The apparatus of claim 17 wherein the width ensures the recessed portion is formed in the solder mask at least a minimum distance from a bond finger configured to bond with a wired connection to the die.

19. The apparatus of claim 15 wherein the solder mask comprises a first layer and a second layer applied on the first layer, wherein the recessed portion comprises a depth equal to a thickness of the second layer.

* * * * *